US010182292B2

(12) United States Patent
Nicollini et al.

(10) Patent No.: US 10,182,292 B2
(45) Date of Patent: *Jan. 15, 2019

(54) DIFFERENTIAL AMPLIFIER CIRCUIT FOR A CAPACITIVE ACOUSTIC TRANSDUCER AND CORRESPONDING CAPACITIVE ACOUSTIC TRANSDUCER

(71) Applicant: STMicroelectronics S.r.l., Agrate Brianza (IT)

(72) Inventors: Germano Nicollini, Piacenza (IT); Andrea Barbieri, Casalpusterlengo (IT)

(73) Assignee: STMicroelectronics S.r.l., Agrate Brianza (IT)

(*) Notice: Subject to any disclaimer, the term of this patent is extended or adjusted under 35 U.S.C. 154(b) by 0 days.

This patent is subject to a terminal disclaimer.

(21) Appl. No.: 15/868,480

(22) Filed: Jan. 11, 2018

(65) Prior Publication Data

US 2018/0139536 A1 May 17, 2018

Related U.S. Application Data

(63) Continuation of application No. 15/466,385, filed on Mar. 22, 2017, now Pat. No. 9,877,106, which is a
(Continued)

(30) Foreign Application Priority Data

May 29, 2015 (IT) .................. 102015000019419

(51) Int. Cl.
*H04R 3/00* (2006.01)
*H03F 3/45* (2006.01)
(Continued)

(52) U.S. Cl.
CPC ........... *H04R 3/007* (2013.01); *B06B 1/0292* (2013.01); *H03F 3/181* (2013.01); *H03F 3/187* (2013.01);
(Continued)

(58) Field of Classification Search
CPC .... H03F 3/45; H03F 3/45076; H03F 3/45479; H03F 3/45488; H03F 2203/45112;
(Continued)

(56) References Cited

U.S. PATENT DOCUMENTS 7,564,306 B2 * 7/2009 Lee ..................... H03F 1/08
330/258
7,756,279 B2 7/2010 Deruginsky et al.
(Continued)

FOREIGN PATENT DOCUMENTS

| EP | 2 270 979 A1 | 1/2011 |
| EP | 2 653 845 A1 | 10/2013 |
| EP | 2 653 846 A1 | 10/2013 |

OTHER PUBLICATIONS

Alzaher et al., "A CMOS Fully Balanced Differential Difference Amplifier and Its Applications," IEEE Transactions on Circuits and Systems—II: Analog and Digital Signal Processing, 48(6), Jun. 2001, pp. 614-620.
(Continued)

*Primary Examiner* — Jason R Kurr
(74) *Attorney, Agent, or Firm* — Seed IP Law Group LLP

(57) ABSTRACT

An amplifier circuit, for a capacitive acoustic transducer defining a sensing capacitor that generates a sensing signal as a function of an acoustic signal, has a first input terminal and a second input terminal, which are coupled to the sensing capacitor: a dummy capacitor, which has a capacitance corresponding to a capacitance at rest of the sensing capacitor and a first terminal connected to the first input terminal; a first amplifier, which is coupled at input to the second input terminal and defines a first differential output of the circuit; a second amplifier, which is coupled at input to a second terminal of the dummy capacitor and defines a second differential output of the circuit; and a feedback stage, which is coupled between the differential
(Continued)

outputs and the first input terminal, for feeding back onto the first input terminal a feedback signal, which has an amplitude that is a function of the sensing signal and is in phase opposition with respect thereto.

20 Claims, 5 Drawing Sheets

Related U.S. Application Data continuation of application No. 14/960,155, filed on Dec. 4, 2015, now Pat. No. 9,634,628.

(51) Int. Cl.
*H04R 19/04* (2006.01)
*H04R 19/00* (2006.01)
*H03F 3/181* (2006.01)
*H03F 3/187* (2006.01)
*B06B 1/02* (2006.01)
*H04R 29/00* (2006.01)

(52) U.S. Cl.
CPC ..... *H03F 3/45076* (2013.01); *H03F 3/45475* (2013.01); *H04R 3/00* (2013.01); *H04R 19/005* (2013.01); *H04R 19/04* (2013.01); *H04R 29/004* (2013.01); *H03F 2200/03* (2013.01); *H03F 2203/45112* (2013.01); *H03F 2203/45116* (2013.01); *H04R 2410/03* (2013.01); *H04R 2499/11* (2013.01)

(58) Field of Classification Search
CPC . H03F 2203/45114; H03F 2203/45116; H03F 2203/45118; H03F 3/181; H03F 3/187; H03F 3/45192; H03F 3/456; H03F 2200/03; H04R 19/005; H04R 19/04; H04R 2201/003; H04R 2499/11; H04R 3/007; H04R 29/004; B06B 1/0292
USPC .................................................. 381/113, 120
See application file for complete search history.

(56) References Cited

U.S. PATENT DOCUMENTS

| | | |
|---|---|---|
| 8,023,667 B2 | 9/2011 | Lin |
| 8,374,363 B2 | 2/2013 | Onishi |
| 8,884,699 B2 | 11/2014 | Casiraghi et al. |
| 2009/0110213 A1 | 4/2009 | Holzmann |

OTHER PUBLICATIONS

Jawed, "CMOS Readout Interfaces for MEMS Capacitive Microphones," PhD Dissertation, International Doctorate School in Information and Communication Technologies, DIT—University of Trento, Mar. 2009, 123 pages.

Säckinger et al., "A Versatile Building Block: The CMOS Differential Difference Amplifier," IEEE Journal of Solid-State Circuits, SC-22(2), Apr. 1987, pp. 287-294.

* cited by examiner

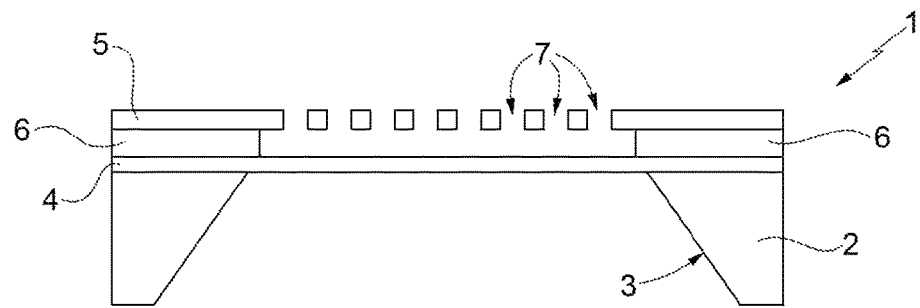
FIG. 1
(Background Art)
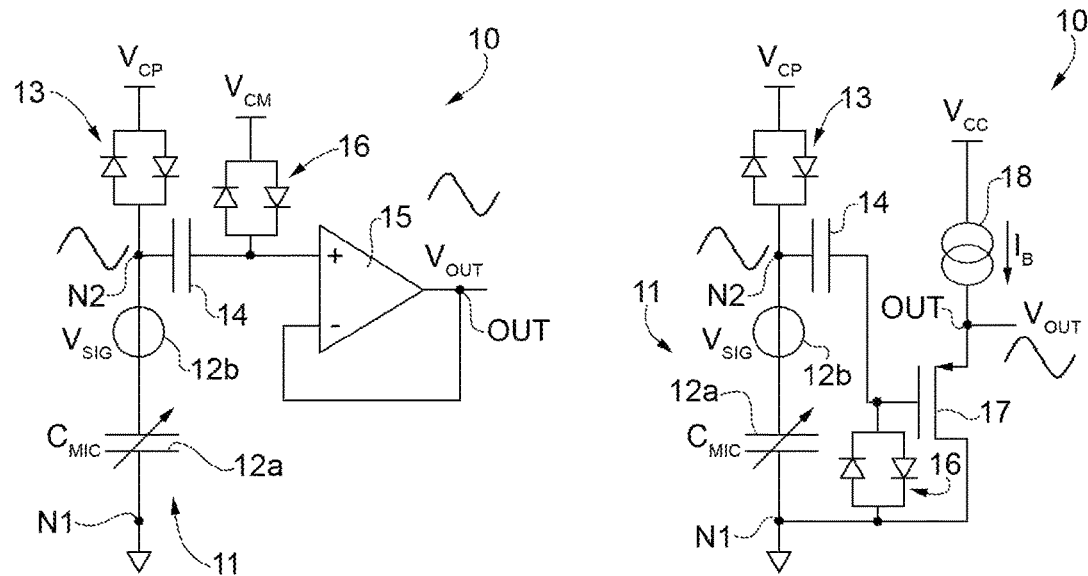
FIG. 2A
(Background Art)
FIG. 2B
(Background Art)

DIFFERENTIAL AMPLIFIER CIRCUIT FOR A CAPACITIVE ACOUSTIC TRANSDUCER AND CORRESPONDING CAPACITIVE ACOUSTIC TRANSDUCER

BACKGROUND

Technical Field

The present disclosure relates to a differential amplifier circuit for a capacitive acoustic transducer.

Description of the Related Art

As is known, an acoustic transducer of a capacitive type generally comprises a sensing structure, designed to transduce acoustic pressure waves into an electrical quantity (in particular, a capacitive variation), and an electronic reading interface, designed to carry out appropriate processing operations (amongst which amplification operations) on said electrical quantity for supplying an electrical output signal (for example, a voltage).

The sensing structure in general comprises a mobile electrode, in the form of a diaphragm or membrane, arranged facing a fixed electrode, at a short distance (the so-called "air gap"), to form the plates of a sensing capacitor with a capacitance varying as a function of the acoustic pressure waves to be detected. The mobile electrode is generally free to move, or undergo deformation, in response to the pressure exerted by the incident acoustic waves, in this way causing the capacitance variation of the sensing capacitor.

For example, MEMS (Micro-Electro-Mechanical System) capacitive acoustic transducers are known, in which the sensing structure is of a micromechanical type built using integrated micromachining techniques typical of the semiconductor industry.

By way of example, FIG. 1 shows a micromechanical structure 1 of a MEMS acoustic transducer, of a known type, which comprises a structural layer or substrate 2 of semiconductor material, for example silicon, in which a cavity 3 is made, for example via chemical etching from the back. A membrane, or diaphragm, 4 is coupled to the structural layer 2 and closes the cavity 3 at the top. The membrane 4 is flexible and, in use, undergoes deformation as a function of the pressure of incident acoustic waves.

A rigid plate 5 (generally known as "back-plate") is arranged facing the membrane 4, in this case above it, via interposition of spacers 6 (for example of insulating material, such as silicon oxide). The rigid plate 5 constitutes the fixed electrode of a sensing capacitor with variable capacitance, the mobile electrode of which is constituted by the membrane 4, and has a plurality of holes 7, designed to enable free circulation of air towards the membrane 4 (rendering the rigid plate 5 in effect acoustically transparent).

The micromechanical structure 1 further comprises (in a way not illustrated) electrical membrane and rigid-plate contacts, used for biasing the membrane 4 and the rigid plate 5 and acquiring a sensing signal indicative of the capacitive variation due to deformation of the membrane 4 caused by incident acoustic pressure waves. Typically, these electrical contacts are arranged in a surface portion of the die in which the micromechanical structure is provided.

In general, the sensing structure of capacitive acoustic transducers is charge-biased, usually via a fixed charge. In particular, a DC biasing voltage is applied, usually from a charge-pump stage (the higher this voltage, the greater the sensitivity of the microphone), and a high-impedance element is inserted (with impedance of the order of teraohms, for example between 100 G$\Omega$ and 10 T$\Omega$) between the charge-pump stage and the sensing structure.

This high-impedance element may, for example, be provided by a pair of diodes arranged in back-to-back configuration, i.e., connected together in parallel, with the cathode terminal of one of the two diodes connected to the anode terminal of the other, and vice versa, or by a series of pairs of diodes in the back-to-back configuration. The presence of this high impedance "insulates" the DC charge stored in the sensing structure from the charge-pump stage, for frequencies higher than a few hertz.

Since the amount of charge is fixed, an acoustic signal (acoustic pressure), which impinges upon the mobile electrode of the sensing structure, modulates the gap with respect to the rigid electrode, producing a capacitive variation and consequently a voltage variation.

This voltage is processed, in the electronic interface, by an electronic amplifier circuit, which is required to have a high input impedance (to prevent perturbation of the charge stored in the micromechanical structure), and then is converted into a low-impedance signal (designed to drive an external load).

FIG. 2a shows a possible embodiment of the amplifier circuit, designated by 10, in this case with a single output, of a so-called "single-ended" type.

The sensing structure of the capacitive acoustic transducer, designated as a whole by 11, is represented schematically by a sensing capacitor 12a with capacitance $C_{MIC}$, which varies as a function of the acoustic signal detected, connected in series to a voltage generator 12b, which supplies a sensing voltage $V_{SIG}$ (having, in the example illustrated in FIG. 2, a generically sinusoidal waveform).

Given that, typically, the mobile electrode has a high parasitic capacitance towards the substrate (comparable with the capacitance of the sensing capacitor of the sensing structure), whereas the rigid electrode has a lower parasitic capacitance, the mobile electrode is generally electrically connected to a first low-impedance input terminal N1, for example to a reference ground voltage of the circuit, whereas the rigid electrode is electrically connected to a second input terminal N2, on which the sensing voltage $V_{SIG}$, indicative of the capacitive variations of the sensing capacitor 12a, is acquired.

The second input terminal N2 is further electrically connected to a biasing stage, for example a charge-pump biasing stage (here not illustrated), by interposition of a first high-impedance insulating element 13, constituted by a pair of diodes arranged in back-to-back configuration, for receiving a biasing voltage $V_{CP}$.

The amplifier circuit 10 further comprises a decoupling capacitor 14, and an amplifier 15, in buffer or voltage-follower single-ended configuration (i.e., with its inverting input connected to the single output). For example, the amplifier 15 is a class-A, or else a class-AB, operational amplifier.

The decoupling capacitor 14 (which operates to decouple the DC component and couple the detected signal) is connected between the second input terminal N2 and the non-inverting input of the amplifier 15, which further receives an operating voltage $V_{CM}$ from an appropriate reference-generator stage (here not illustrated), via interposition of a second high-impedance insulating element 16, constituted by a respective pair of diodes arranged in back-to-back configuration.

The operating voltage $V_{CM}$ is a DC biasing voltage, appropriately selected for setting the operating point of the amplifier 15. This operating voltage $V_{CM}$ is chosen, for example, in a range comprised between a supply voltage of the amplifier 15 (not shown) and the reference ground voltage.

During operation of the capacitive acoustic transducer, the (AC) sensing voltage $V_{SIG}$ is thus superimposed on this DC operating voltage $V_{CM}$.

The amplifier 15 supplies on the single output OUT an output voltage $V_{OUT}$, as a function of the sensing voltage $V_{SIG}$ detected by the sensing structure 11 of the capacitive acoustic transducer. The output voltage $V_{OUT}$ has, in the example, a sinusoidal waveform that corresponds in amplitude to the sensing voltage $V_{SIG}$ (as represented schematically in FIG. 2A).

FIG. 2B shows a further embodiment of a known-type amplifier circuit 10, which also in this case has a single-ended output.

The amplifier circuit 10 here comprises a MOS transistor 17 (in the example of a PMOS type) in source-follower configuration, which has its gate terminal connected to the second input terminal N2 via the decoupling capacitor 14, its source terminal that supplies the output voltage $V_{OUT}$ on the single output OUT, and its drain terminal connected to the reference ground voltage.

The source terminal of the MOS transistor 17 further receives a biasing current $I_B$ from a current generator 18 connected to a line set at a supply voltage $V_{cc}$. The second insulating element 16 in this case couples the gate terminal of the MOS transistor 17 to the ground reference.

In general, the single-ended circuit configuration presents some drawbacks, amongst which a poor rejection in regard to any common-mode component of disturbance, for example, deriving from power-supply noise or cross-talk from nearby devices with time-varying signals.

To overcome these drawbacks, it has been proposed to replace the single-ended solution with a configuration, defined as "pseudo-balanced" or "pseudo-differential", which is illustrated in FIGS. 3A and 3B.

This solution envisages that the amplifier circuit 10 comprises a dummy capacitor 19, constituted by a capacitor of a classic type, for example metal-oxide-metal (MOM) or metal-insulator-metal (MIM), having a capacitance $C_{DUM}$, with a nominal value substantially equal to the capacitance at rest (i.e., in the absence of external stresses) $C_{MIC}$ of the sensing capacitor 12a.

The amplifier circuit 10 has in this case the exact duplication of the circuit elements previously described with reference to FIGS. 2A and 2B (the duplicated elements are distinguished with a prime sign in FIGS. 3A and 3B and are not described again), for generation on a further output OUT' of a DC output voltage $V_{out\_DUM}$ designed to balance the output voltage $V_{out}$, thus enabling elimination of the common-mode disturbance. Basically, two altogether equivalent circuit paths are created.

Also this solution is, however, not free from drawbacks.

In particular, given that the contribution of the sensing signal is present only on one of the two circuit paths, i.e., the one that goes from the sensing capacitor 12a to the output OUT (thereby, the "pseudo" differential nature of the amplifier circuit 10), on the same output OUT a greater voltage swing is required, in particular with a value twice that of a fully differential solution (where half of the swing would be present on the output OUT and the other half of the swing, in phase opposition, on the further output OUT').

A higher value of the supply voltage $V_{cc}$ is thus required, with consequent increase in power consumption.

To overcome the above problem related to the swing on the output of the amplifier, a further solution that has been proposed, illustrated in FIG. 4, envisages use of a differential amplifier 25 with four inputs and two outputs, the so-called DDA (Differential Difference Amplifier), having a differential and unity-gain architecture (the voltage difference between the differential output terminals, which are here designated by Out1 and Out2, is equivalent to the voltage difference between the differential input terminals, which are here designated by 25a and 25c).

The structure of the differential amplifier 25 is described in detail for example in:

"A versatile building block: the CMOS differential difference amplifier", E. Sackinger, W. Guggenbuhl, IEEE Journal of Solid-State Circuits, Vol. 22, April 1987; or "A CMOS Fully Balanced Differential Difference Amplifier and Its Applications", H. Alzaher, M. Ismail, IEEE TCAS-II: Analog and Digital Signal Processing, Vol. 48, No. 6, June 2001.

In particular, the second input terminal N2 is in this case connected, via interposition of the decoupling capacitor 14, to a first non-inverting input 25a of the differential amplifier 25, a first inverting input 25b of which is directly feedback-connected to a first differential output terminal $Out_1$.

Likewise, the dummy capacitor 19 has a respective first terminal, designated by N1', connected to the ground reference terminal, and a second terminal N2' connected, via interposition of a respective decoupling capacitor 14', to a second inverting input 25c of the differential amplifier 25, a second non-inverting input 25d of which is further directly feedback-connected to a second differential output terminal $Out_2$ (the output voltage $V_{out}$ being present between the first and second differential output terminals $Out_1$, $Out_2$).

The respective second input terminal N2' of the dummy capacitor 19 further receives the biasing voltage $V_{CP}$ through a respective first insulating element 13', constituted by a pair of diodes arranged in back-to-back configuration and receiving the biasing voltage $V_{CP}$. Likewise, the second inverting input 25c receives the operating voltage $V_{CM}$, via a respective second high-impedance insulating element 16', which in the example is also constituted by a pair of diodes arranged in back-to-back configuration (the operating voltage $V_{CM}$ is thus a common-mode voltage for the first non-inverting input 25a and for the second inverting input 25c of the differential amplifier 25).

The dummy capacitor 19, in this case, enables creation of a substantially balanced path for the buffer inputs (i.e., the non-inverting input 25a and the inverting input 25c) of the differential amplifier 25, for a better common-mode noise rejection.

Even though it enables improvement of the capacity of disturbance rejection, also the differential configuration described with reference to FIG. 4 has some drawbacks.

In particular, the above solution involves two differential input stages, with a consequent increase in noise and current consumption. It has a wide common-mode input interval on account of the different signals present on the four inputs of the differential amplifier 25. The transistors of each input stage are driven by a differential signal having a large amplitude, i.e., the virtual-ground principle does not apply (as is known to a person skilled in the sector), with a consequent high distortion for signals of large amplitude. Finally, the differential signal is effectively present only on the differential output terminals $Out_1$, $Out_2$, whereas the input terminals are not fully differential.

In general, the need is thus felt to provide an amplifier circuit for a capacitive acoustic transducer that will enable the disadvantages and limitations associated to known solutions to be overcome, at least in part.

BRIEF SUMMARY

One aim of the present disclosure is to meet the aforesaid need, and in particular to provide an amplifier circuit of a fully differential type for a capacitive acoustic transducer.

Consequently, according to the present disclosure an amplifier circuit for a capacitive acoustic transducer and a corresponding capacitive acoustic transducer are provided, as defined in the annexed claims.

BRIEF DESCRIPTION OF THE SEVERAL VIEWS OF THE DRAWINGS

For a better understanding of the present disclosure, a preferred embodiment thereof is now described purely by way of non-limiting example and with reference to the attached drawings, wherein:

FIG. 1 is a schematic cross-sectional view of a micromechanical structure of a known capacitive acoustic transducer, of a MEMS type;

FIGS. 2A and 2B show circuit diagrams of a single-output amplifier circuit, of a known type, for the capacitive acoustic transducer;

DETAILED DESCRIPTION

Figure 5:
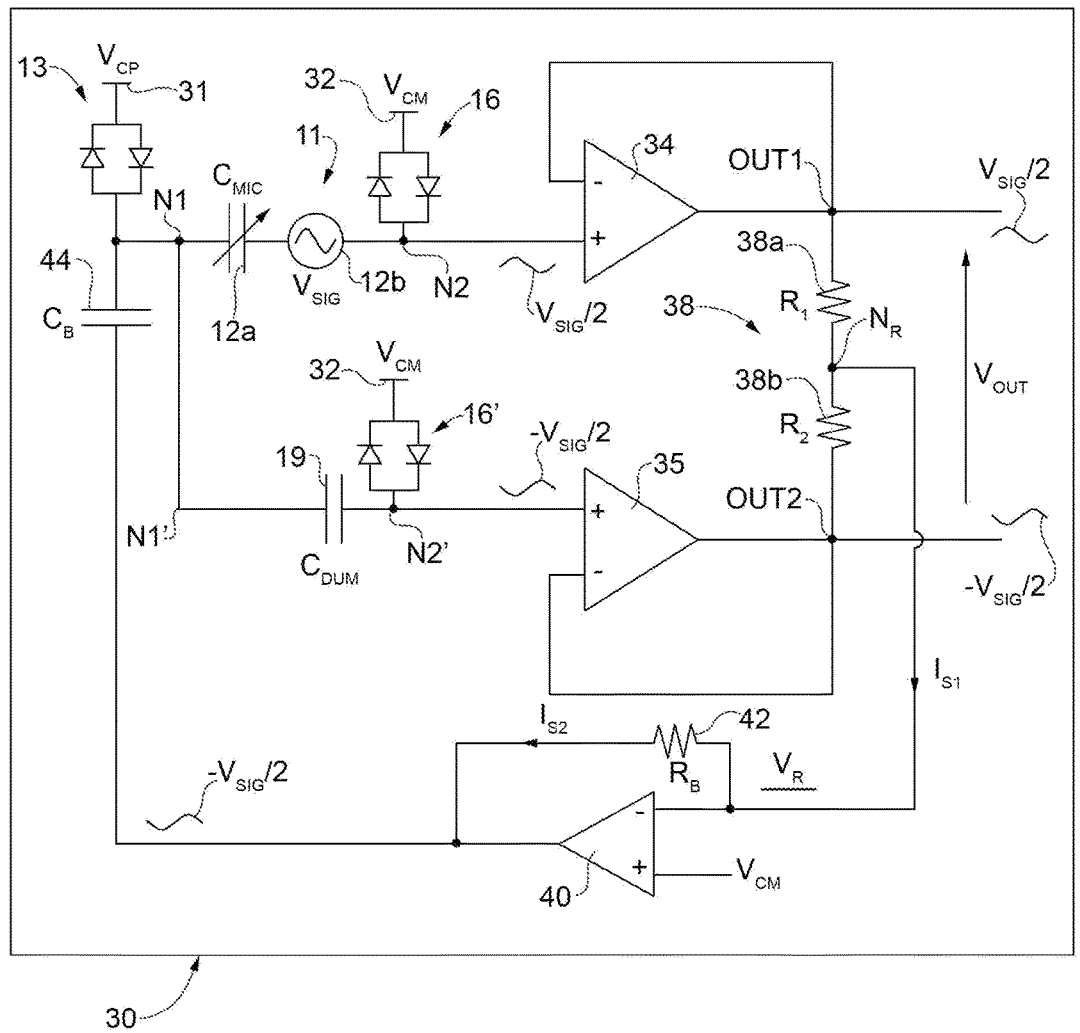
FIG. 5 is a circuit diagram of a fully differential amplifier circuit for the capacitive acoustic transducer, according to one embodiment of the present solution.

As illustrated in FIG. 5, one aspect of the present solution envisages providing an amplifier circuit 30 for a capacitive acoustic transducer (obtained as described previously) of a fully differential (or fully balanced) type.

The amplifier circuit 30 once again comprises: the high-resistance insulating element 13, for example constituted by a pair of diodes arranged in back-to-back configuration, connected between a biasing line 31, which receives the biasing voltage $V_{CP}$, for example from a charge-pump stage (here not illustrated) and, in this case, the first input terminal N1 designed to be coupled to the sensing capacitor 12a; and the dummy capacitor 19, which in this case has a first terminal N1' connected to the same first input terminal N1, and a second terminal N2'.

The amplifier circuit 30 further comprises a first amplifier 34 and a second amplifier 35, in buffer or voltage-follower single-ended configuration (i.e., with single output and with inverting input connected to the single output, these amplifiers being referred to in what follows as "buffer amplifiers"). For example, the first and second buffer amplifiers 34, 35 have unity gain and are in source-follower configuration.

The output terminals of the buffer amplifiers 34, 35 define the first and second output terminals $Out_1$, $Out_2$ of the amplifier circuit 30, between which the output voltage $V_{out}$ is present, the value of which is a function of the sensing voltage $V_{SIG}$ generated by the sensing structure 11 of the capacitive acoustic transducer in response to acoustic stresses.

In greater detail, the second input terminal N2, which is designed to be connected to the sensing capacitor 12a and on which the sensing voltage $V_{SIG}$ is present, is connected to the non-inverting input of the first buffer amplifier 34, and the second terminal N2' of the dummy capacitor 19 is connected to the non-inverting input of the second buffer amplifier 35.

Furthermore, the non-inverting inputs of the first and second buffer amplifiers 34, 35 are connected to a respective biasing line 32, from which they receive the operating voltage $V_{CM}$ supplied by an appropriate reference-generator stage (here not illustrated) via interposition of a respective high-impedance insulating element 16, 16' constituted by a respective pair of diodes arranged in back-to-back configuration. As discussed previously, the operating voltage $V_{CM}$ is an appropriate DC biasing voltage, which sets the working point of the buffer amplifiers 34 and 35 (i.e., the reference voltage at input to the same buffer amplifiers 34, 35).

The amplifier circuit 30 further comprises: a resistive divider 38, formed by a first division resistor 38a and by a second division resistor 38b, which are connected in series between the first and second output terminals $Out_1$, $Out_2$ and define between them a feedback node $N_R$; a feedback amplifier 40, for example a high-gain OTA (Operational Transconductance Amplifier), which has its inverting input connected to the feedback node $N_R$, its non-inverting input which also receives the operating voltage $V_{CM}$, and a feedback resistor 42 connected between its inverting input and a corresponding output; and a feedback capacitor 44, which is connected between the output of the feedback amplifier 40 and the first input terminal N1, and has a capacitance $C_B$ much higher than the sum of the capacitances $C_{MIC}$ and $C_{DUM}$ of the sensing capacitor 12a and of the dummy capacitor 19:

$$C_B >> C_{MIC} + C_{DUM}.$$

For example, capacitances $C_{MIC}$ and $C_{DUM}$ are in the region of 1 pF, whereas the capacitance $C_B$ is in the region of 10-20 pF.

In particular, for the reasons that will be discussed hereinafter, the value of resistance $R_1$ of the first division resistor 38a satisfies the following relation with the value of resistance $R_2$ of the second division resistor 38b and with the value of resistance $R_B$ of the feedback resistor 42:

$$R_1 = R_2 // R_B$$

The amplifier circuit 30 has a fully differential configuration, both at input and at output in so far as it has two outputs, at the output terminals $Out_1$, $Out_2$, which are in phase opposition, in particular with a phase shift of 180°, with respect to one another, the difference of which define the output voltage $V_{out}$; and two inputs, at the non-inverting inputs of the first and second buffer amplifiers 34, 35, which are also in phase opposition, in particular with a phase shift of 180°, with respect to one another.

During operation, the virtual short-circuit at input to the feedback amplifier 40 and the feedback action cause the voltage on the feedback node $N_R$ to be equal to the operating voltage $V_{CM}$ (superimposed on which is an oscillation of negligible value, since the gain of the feedback amplifier 40 is assumed as being very high).

Therefore, the first and second output terminals $Out_1$, $Out_2$ are at voltages of equal amplitude and in phase opposition (given that the voltage on the feedback node $N_R$ is given by the half-sum of the same voltages). In other words, the voltage on the feedback node $N_R$ is the common-mode voltage between the output terminals $Out_1$, $Out_2$.

In particular, the voltage on the first output terminal $Out_1$ is equal to $+V_{SIG}/2$, whereas the voltage on the second output terminal $Out_2$ is equal to $-V_{SIG}/2$.

Furthermore, it may be easily shown that the bottom plate of the feedback capacitor 44, connected to the output of the feedback amplifier 40, is set at a feedback voltage $V_R$ with a value of $-V_{SIG}/2$, and the sinusoidal variation of this voltage is fed back, substantially unchanged, onto the first input terminal N1, given the relation between the values of capacitance of the feedback capacitor 44, of the sensing capacitor 12a, and of the dummy capacitor 19.

In other words, the voltage on the bottom plate of the feedback capacitor 44 varies, phase-shifted by 180°, of a value equal to half of the sensing voltage $V_{SIG}$, consequently shifting the voltages on the non-inverting input of each of the first and second buffer amplifiers 34, 35.

Consequently, on the non-inverting node of the first buffer amplifier 34 a voltage equal to $+V_{SIG}/2$ is present (given by the difference between the sensing voltage $V_{SIG}$ and the voltage fed back onto the first input terminal N1), whereas on the non-inverting node of the second buffer amplifier 35 a voltage equal to $-V_{SIG}/2$ is present.

In other words, a purely, or truly, differential signal is present both between the inputs and between the outputs of the amplifier circuit 30.

The expression referred to previously for the relation between the value of resistance $R_1$ of the first division resistor 38a, the value of resistance $R_2$ of the second division resistor 38b, and the value of resistance $R_B$ of the feedback resistor 42 is now discussed.

For this purpose, the current coming out of the feedback node $N_R$ is designated by $I_{S1}$, and the current that circulates in the feedback resistor 42 is designated by $I_{S2}$. The following expressions apply:

$$I_{S1}=V_{SIG}/2R_1-V_{SIG}/2R_2$$

$$I_{S2}=V_{SIG}/2R_B$$

However, $I_{S2}=I_{S1}$, then:

$$V_{SIG}/2R_1-V_{SIG}/2R_1=V_{SIG}/2R_B$$

and consequently $$1/R_1-1/R_2=1/R_B$$

$$1/R_1=1/R_2+1/R_B$$

i.e., $$R_1=R_2//R_B.$$

The advantages of the solution proposed are clear from the foregoing description.

In any case, it is emphasized once again that the amplifier circuit 30 for the capacitive acoustic transducer provides a fully differential solution, with input and output signals in phase opposition.

Figure 3A:
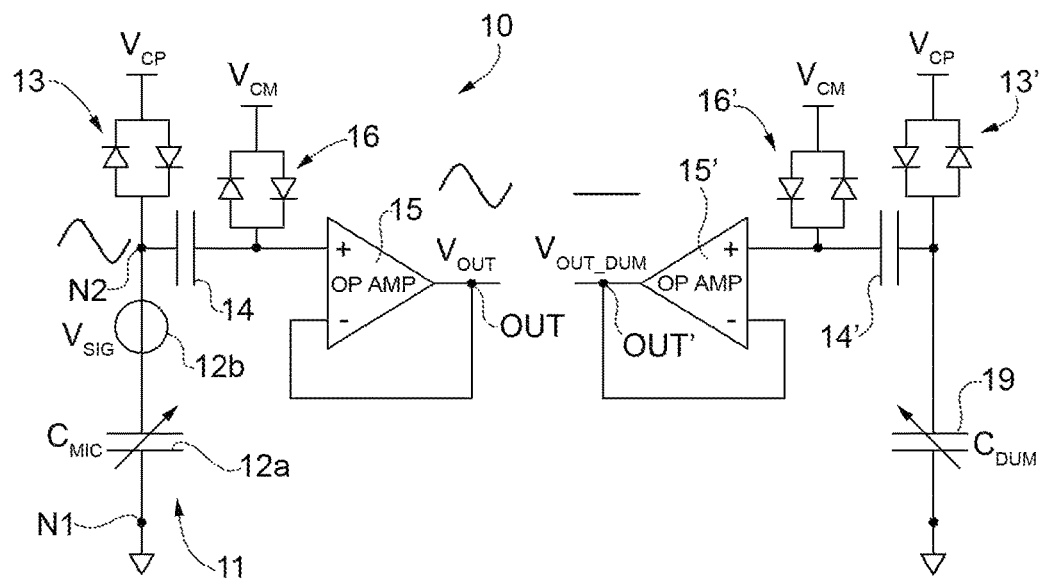
FIGS. 3A and 3B show circuit diagrams of pseudo-differential amplifier circuits of a known type for the capacitive acoustic transducer.
Figure 3B:
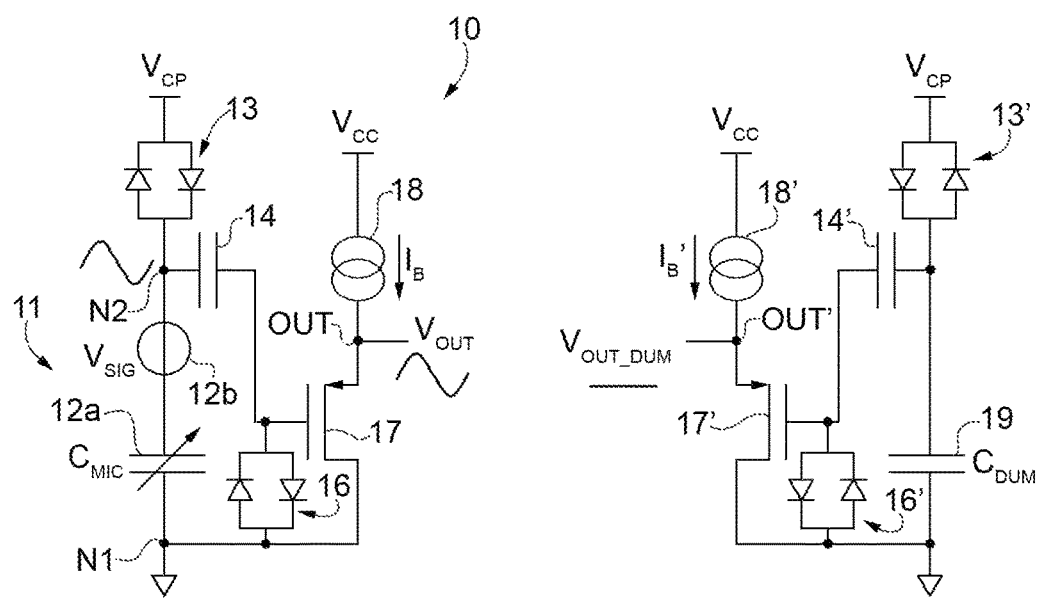
Figure 4:
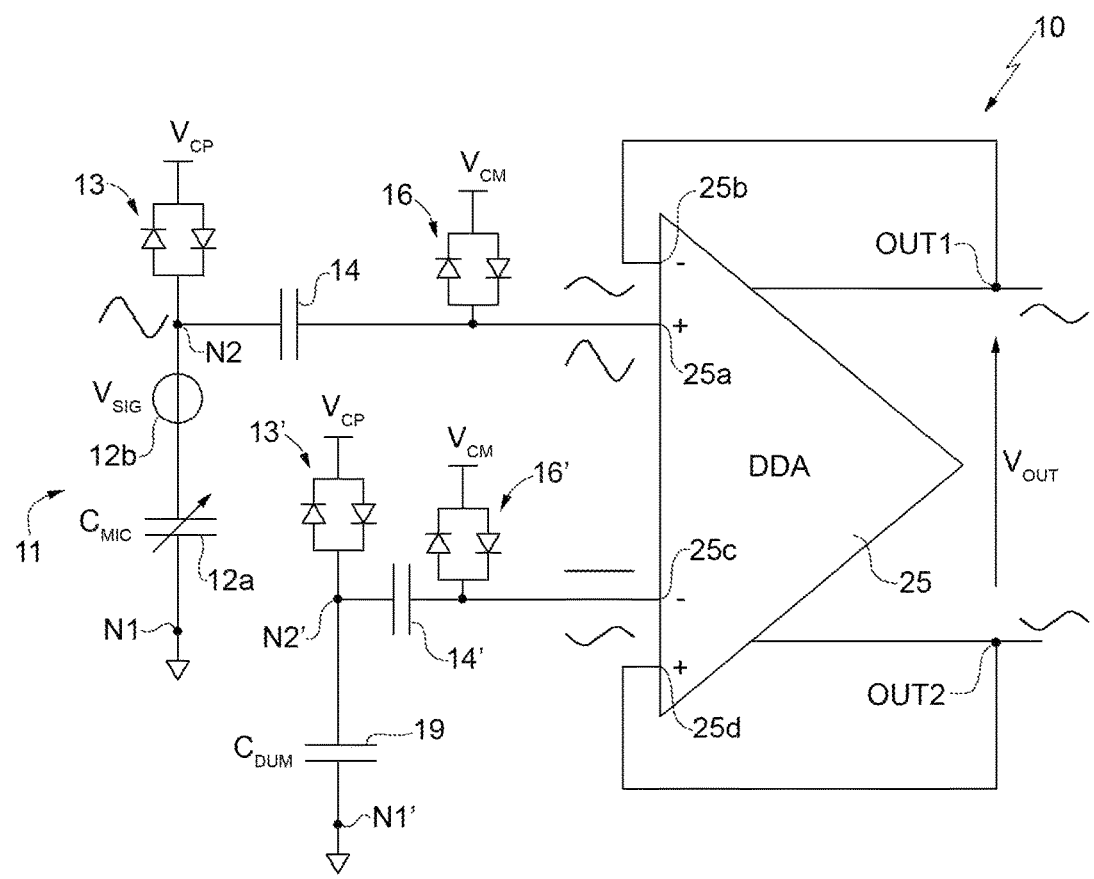
FIG. 4 is a circuit diagram of a differential amplifier circuit of a known type for the capacitive acoustic transducer.

The above solution thus enables the disadvantages of known solutions to be overcome thanks to the following. The principle of a virtual short-circuit at the inputs of the amplifiers, in particular the buffer amplifiers 34, 35, is respected. Differential signals are present also at the inputs of the amplifier circuit 30, not only at the outputs. Use of a complex circuit structure (for example, of the type described with reference to FIG. 4, having two differential input stages) is not required, thus preventing the associated harmonic distortions, the trade-off required with noise, and signal attenuation.

The solution proposed does not require any modification to the manufacturing method or to the technology used for manufacturing the acoustic transducer, for example of a MEMS type, as compared to traditional solutions.

Figure 6:
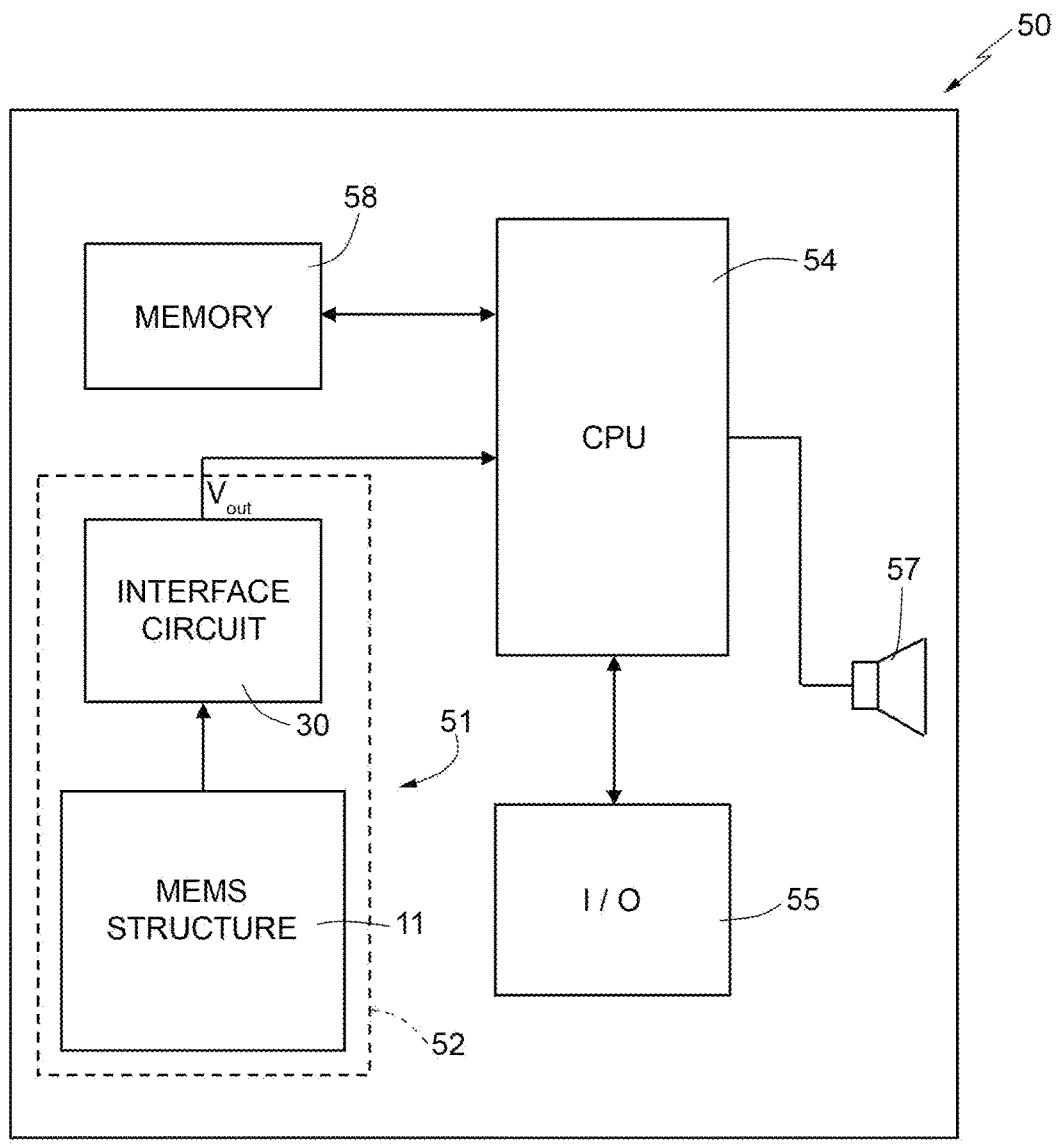
FIG. 6 is a general block diagram of an electronic device incorporating the capacitive acoustic transducer, according to a further aspect of the present solution.

The above features thus make the use of the acoustic transducer advantageous in an electronic device 50, in particular of a portable type, as illustrated schematically in FIG. 6.

In FIG. 6, designated by 51 is the capacitive acoustic transducer, for example of a MEMS type, which may include, within a same package 52, the sensing structure 11, comprising, for example, an appropriate micromechanical structure, and the reading interface circuit including the amplifier circuit 30, supplying the output voltage $V_{out}$; the reading interface circuit may be obtained in the same die as that in which the micromechanical structure is provided, or in a different die, which may in any case be housed in the same package 52.

The electronic device 50 is, for example, a portable mobile communication device, such as a cellphone, a PDA (personal digital assistant), a portable computer, but also a digital audio player with voice-recording capacity, a photographic or video camera, a controller for videogames, etc. The electronic device 50 is generally able to process, store, and/or transmit and receive signals and information.

The electronic device 50 further comprises a microprocessor 54, which receives the signals detected by the acoustic transducer 51 (the output voltage $V_{out}$, possibly being further processed), and an input/output (I/O) interface 55, for example provided with a keypad and a display, connected to the microprocessor 54.

Furthermore, the electronic device 50 may comprise a speaker 57, for generating sounds on an audio output (not shown), and a non-volatile internal memory 58.

Finally, it is clear that modifications and variations may be made to what has been described and illustrated herein, without thereby departing from the scope of the present disclosure.

In particular, the solution described may find advantageous application both for analog acoustic transducers and for digital acoustic transducers.

Furthermore, as previously highlighted, the solution described may apply also to different types of acoustic transducers, for example to ECMs (Electret Condenser Microphones), comprising, in a known way, a deformable conductive membrane capacitively coupled to a fixed electrode or plate.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A differential amplifier circuit, comprising:
   an acoustic transducer including a first input node and a second input node, the acoustic transducer configured to generate a sensing signal based upon an acoustic signal;
   a reference circuit having first and second input nodes, the first input node coupled to the first input node of the acoustic transducer and the reference circuit generating a value corresponding to a value of the sensing signal in the absence of the acoustic signal;
   a first amplifier coupled to the second input node of the acoustic transducer and having an output node defining a first differential output of the amplifier circuit;
   a second amplifier coupled to the second input node of the reference circuit and having an output node defining a second differential output of the amplifier circuit; and
   a feedback circuit coupled between the first and second differential output nodes and the first input node of the acoustic transducer, the feedback circuit configured to generate a feedback signal on the first input node.

2. The differential amplifier circuit of claim 1, wherein the reference circuit comprises a dummy capacitor coupled between the first and second input nodes of the reference circuit.

3. The differential amplifier circuit of claim 2, wherein the acoustic transducer comprises a sensing capacitor coupled in series with a sensing signal generator between the first and second input nodes of the acoustic transducer.

4. The differential amplifier circuit of claim 3, wherein the sensing signal has an amplitude and a phase, and wherein the feedback signal has an amplitude based on the amplitude of the sensing signal.

5. The differential amplifier circuit of claim 4, wherein the phase of the feedback signal is in phase opposition with the phase of the sensing signal.

6. The differential amplifier circuit of claim 1, wherein each of the first and second amplifiers comprises a unity-gain voltage follower buffer amplifier.

7. The differential amplifier circuit of claim 1, wherein the feedback circuit comprises a resistive divider circuit including a feedback node.

8. The differential amplifier circuit of claim 7, wherein voltages on the first and second differential outputs have approximately equal amplitudes and are in phase opposition, and wherein a feedback voltage on the feedback node is equal to a common mode voltage of the voltages on the first and second differential outputs.

9. The differential amplifier circuit of claim 8, further comprising:
   a first biasing circuit configured to provide a first biasing voltage to the first input node of the acoustic transducer;
   a second biasing circuit configured to provide a second biasing voltage to the second input node of the acoustic transducer; and
   a third biasing circuit configured to provide the second biasing voltage to the second input node of the reference circuit.

10. The differential amplifier circuit of claim 9, wherein each of the first, second and third biasing circuits comprises a pair of back-to-back diodes.

11. The differential amplifier circuit of claim 1, wherein the acoustic transducer comprises an electret condenser microphone.

12. An electronic device, comprising:
    an acoustic transducer including a sensing structure having a sensing capacitor including a first input node and a second input node, the acoustic transducer configured to generate a sensing signal across the first and second input nodes as a function of variations in a capacitance value of the sensing capacitor responsive to an acoustic signal;
    an amplifier circuit including,
       a reference circuit having first and second input nodes, the first input node coupled to a first input node of the acoustic transducer and the reference circuit configured to generate a reference signal having a value corresponding to a value of the sensing signal in the absence of the acoustic signal;
       a first amplifier coupled to the second input node of the acoustic transducer and having an output node corresponding to a first differential output of the amplifier circuit;
       a second amplifier coupled to the second input node of the reference circuit and having an output node corresponding to a second differential output of the amplifier circuit; and
       a feedback circuit coupled between the first and second differential output nodes and the first input node of the acoustic transducer, the feedback circuit configured to generate a feedback signal on the first input node; and
    a processor coupled to the amplifier circuit.

13. The electronic device of claim 12, wherein the amplifier circuit comprises a fully differential amplifier and wherein each of the first and second amplifiers comprises an operational amplifier.

14. The electronic device of claim 13, wherein each operational amplifier is configured in a unity-gain voltage follower configuration.

15. The electronic device according to claim 13, wherein the electronic device comprises one of a cellphone; a personal digital assistant; a portable computer; a digital audio player with voice-recording capacity; a photographic camera or video camera; and a control device for videogames.

16. The electronic device according to claim 14, further comprising an input/output interface and a memory coupled to the processor.

17. A method, comprising:
    sensing a value of a variable capacitance element between a first input node and a second input node, the value of the variable capacitance element being a function of an acoustic signal incident on the variable capacitance element;
    providing a reference capacitance value between the first input node and a third input node;
    generating first and second differential output signals in response to signals on the first and third input nodes, respectively, a difference between the first and second differential output signals being a function of the acoustic signal incident on the variable capacitance element;
    generating a feedback signal based upon the first and second differential output signals; and
    providing the feedback signal through a feedback capacitive element to the first input node.

18. The method of claim 17, wherein the feedback signal comprises generating a feedback voltage having a value that is equal to a common mode voltage of the first and second differential output signals.

19. The method of claim 18, wherein generating the first and second differential output signals comprises buffering the signals on the first and third input nodes.

20. The method of claim 19 further comprising biasing the first and third input nodes at a first operating biasing voltage and biasing the second input node at a second biasing voltage.

* * * * *